United States Patent
Muchherla et al.

(12)

(10) Patent No.: US 11,056,156 B2
(45) Date of Patent: *Jul. 6, 2021

(54) OPTIMIZED SCAN INTERVAL

(71) Applicant: Micron Technology, Inc., Boise, ID (US)

(72) Inventors: Kishore Kumar Muchherla, Fremont, CA (US); Ashutosh Malshe, Fremont, CA (US); Harish Reddy Singidi, Fremont, CA (US); Gianni Stephen Alsasua, Rancho Cordova, CA (US); Gary F. Besinga, Boise, ID (US); Sampath Ratnam, Boise, ID (US); Peter Sean Feeley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/749,481

(22) Filed: Jan. 22, 2020

(65) Prior Publication Data

US 2020/0160894 A1 May 21, 2020

Related U.S. Application Data

(63) Continuation of application No. 16/230,251, filed on Dec. 21, 2018, now Pat. No. 10,573,357, which is a
(Continued)

(51) Int. Cl.
*G11C 7/00* (2006.01)
*G11C 7/10* (2006.01)
(Continued)

(52) U.S. Cl.
CPC .............. *G11C 7/1006* (2013.01); *G11C 8/10* (2013.01); *G11C 29/023* (2013.01);
(Continued)

(58) Field of Classification Search
CPC ... G11C 7/1051; G11C 7/1072; G11C 7/1006; G11C 7/1078; G11C 2211/22; G11C 8/00
(Continued)

(56) References Cited

U.S. PATENT DOCUMENTS

| 7,818,525 B1 | 10/2010 | Frost et al. |
| 8,117,406 B2 | 2/2012 | Whang et al. |

(Continued)

FOREIGN PATENT DOCUMENTS

| CN | 111247587 A | 6/2020 |
| CN | 112041931 A | 12/2020 |

(Continued)

OTHER PUBLICATIONS

US 10,163,466 B1, 12/2018, Muchherla et al. (withdrawn)

(Continued)

*Primary Examiner* — Son T Dinh
(74) *Attorney, Agent, or Firm* — Schwegman Lundberg & Woessner, P.A.

(57) ABSTRACT

A variety of applications can include apparatus and/or methods of operating the apparatus that include a memory device having read levels that can be calibrated. A calibration controller implemented with the memory device can trigger a read level calibration based on inputs from one or more trackers monitoring parameters associated with the memory device and a determination of an occurrence of at least one event from a set of events related to the monitored parameters. The monitored parameters can include parameters related to a selected time interval and measurements of read, erase, or write operations of the memory device. Additional apparatus, systems, and methods are disclosed.

20 Claims, 8 Drawing Sheets

Related U.S. Application Data continuation of application No. 15/692,407, filed on Aug. 31, 2017, now Pat. No. 10,446,197.

(51) Int. Cl.
  *G11C 8/10* (2006.01)
  *G11C 29/02* (2006.01)

(52) U.S. Cl.
  CPC ........ *G11C 29/028* (2013.01); *G11C 2216/14* (2013.01); *G11C 2216/22* (2013.01)

(58) Field of Classification Search
  USPC .......................... 365/189.14, 189.15, 185.29
  See application file for complete search history.

(56) References Cited

U.S. PATENT DOCUMENTS

| | | | |
|---|---|---|---|
| 8,291,295 | B2 | 10/2012 | Harari et al. |
| 8,489,907 | B2 | 7/2013 | Wakrat et al. |
| 8,572,310 | B2 | 10/2013 | Oh et al. |
| 8,745,319 | B2 | 6/2014 | Langlois et al. |
| 8,880,779 | B2 | 11/2014 | Fai et al. |
| 8,904,146 | B1 | 12/2014 | Lazar et al. |
| 8,966,319 | B2 | 2/2015 | Fai et al. |
| 9,047,955 | B2 | 6/2015 | Cometti et al. |
| 9,176,864 | B2 | 11/2015 | Gorobets et al. |
| 9,236,147 | B1 | 1/2016 | Bellorado et al. |
| 9,342,389 | B2 | 5/2016 | Tang et al. |
| 9,389,805 | B2 | 7/2016 | Cohen et al. |
| 9,405,717 | B2 | 8/2016 | Brontvein et al. |
| 9,747,158 | B1 | 8/2017 | Kannan et al. |
| 9,747,202 | B1 | 8/2017 | Shaharabany et al. |
| 10,365,854 | B1 | 7/2019 | Muchherla et al. |
| 10,446,197 | B2 * | 10/2019 | Muchherla ........... G11C 29/023 |
| 10,573,357 | B2 * | 2/2020 | Muchherla ........... G11C 29/028 |
| 2008/0130156 | A1 | 6/2008 | Chu et al. |
| 2008/0195801 | A1 | 8/2008 | Cheon et al. |
| 2008/0307192 | A1 | 12/2008 | Sinclair et al. |
| 2010/0312948 | A1 | 12/2010 | Yano et al. |
| 2011/0128778 | A1 | 6/2011 | Chen et al. |
| 2012/0254699 | A1 | 10/2012 | Ruby et al. |
| 2012/0268994 | A1 | 10/2012 | Nagashima |
| 2012/0297122 | A1 | 11/2012 | Gorobets et al. |
| 2013/0176784 | A1 | 7/2013 | Cometti et al. |
| 2013/0346721 | A1 | 12/2013 | Giovannini et al. |
| 2014/0254042 | A1 | 9/2014 | Yeo et al. |
| 2014/0279941 | A1 | 9/2014 | Atkisson |
| 2014/0281260 | A1 | 9/2014 | Peterson et al. |
| 2015/0092489 | A1 | 4/2015 | Wu et al. |
| 2015/0117107 | A1 | 4/2015 | Sun et al. |
| 2015/0127883 | A1 | 5/2015 | Chen et al. |
| 2015/0127889 | A1 | 5/2015 | Hwang |
| 2015/0287453 | A1 | 10/2015 | Wu et al. |
| 2015/0347028 | A1 | 12/2015 | Kotte et al. |
| 2015/0347029 | A1 | 12/2015 | Kotte |
| 2016/0118129 | A1 | 4/2016 | Muchherla et al. |
| 2016/0124679 | A1 | 5/2016 | Huang et al. |
| 2016/0139812 | A1 | 5/2016 | Zhang |
| 2016/0148702 | A1 | 5/2016 | Karakulak et al. |
| 2016/0283138 | A1 | 9/2016 | Lehman et al. |
| 2017/0003880 | A1 | 1/2017 | Fisher et al. |
| 2017/0024163 | A1 | 1/2017 | Zhang et al. |
| 2017/0024326 | A1 | 1/2017 | Luo et al. |
| 2017/0148510 | A1 | 5/2017 | Bazarsky et al. |
| 2017/0206979 | A1 | 7/2017 | Cohen et al. |
| 2018/0165169 | A1 | 6/2018 | Camp et al. |
| 2019/0066739 | A1 | 2/2019 | Muchherla et al. |
| 2019/0122705 | A1 | 4/2019 | Muchherla et al. |
| 2019/0369905 | A1 | 12/2019 | Muchherla et al. |

FOREIGN PATENT DOCUMENTS

| | | | |
|---|---|---|---|
| TW | 201921367 A | | 6/2019 |
| WO | WO-2014209234 A1 | | 12/2014 |
| WO | WO-2019045943 A1 | | 3/2019 |
| WO | WO-2019182760 A1 | | 9/2019 |

OTHER PUBLICATIONS

"International Application Serial No. PCT/US2018/044794, International Search Report dated Nov. 16, 2018", 3 pgs.

"International Application Serial No. PCT/US2018/044794, Written Opinion dated Nov. 16, 2018", 9 pgs.

"International Application Serial No. PCT/US2019/021169, International Search Report dated Jun. 20, 2019", 3 pgs.

"International Application Serial No. PCT/US2019/021169, Written Opinion dated Jun. 20, 2019", 4 pgs.

"Taiwanese Application Serial No. 107128114, First Office Action dated May 16, 2019", w/English Translation, 7 pgs.

"Taiwanese Application Serial No. 107128114, Response filed Aug. 16, 2019 to First Office Action dated May 16, 2019", w/ English Claims, 40 pgs.

Ma, Dongzhe, et al., "LazyFTL: A Page-level Flash Translation Layer Optimized forNAND Flash Memory", SIGMOD'11, (2011), 12 pgs.

Park, Chanik, et al., "A Reconfigurable FTL (Flash Translation Layer) Architecture for NAND Flash-Based Applications", ACM Transactions on Embedded Computing Systems, vol. 7, No. 4, Article 38, (Jul. 2008), 23 pgs.

Yang, Soo-Hyeon, et al., "An Efficient Mapping Table Management in NAND Flash-Based Mobile Computers", B. Murgante et al. (Eds.): ICCSA 2011, Part III, LNCS 6784, (2011), 518-527.

"International Application Serial No. PCT/US2018/044794, International Preliminary Report on Patentability dated Mar. 12, 2020", 11 pgs.

"European Application Serial No. 18852509.1, Response filed Sep. 16, 2020 to Communication pursuant to Rule 161(1) and 162 EPC dated Apr. 14, 2020", 11 pgs.

"International Application Serial No. PCT/US2019/021169, International Preliminary Report on Patentability dated Oct. 1, 2020", 6 pgs.

U.S. Appl. No. 15/692,407, now U.S. Pat. No. 10,446,197, filed Aug. 31, 2017, Optimized Scan Interval.

U.S. Appl. No. 16/230,251, filed Dec. 21, 2018, Optimized Scan Interval.

U.S. Appl. No. 15/924,951, now U.S. Pat. No. 10,365,854, filed Mar. 19, 2018, Tracking Data Temperatures of Logical Block Addresses.

U.S. Appl. No. 16/460,401, filed Jul. 2, 2019, Tracking Data Temperatures of Logical Block Addresses.

"Korean Application Serial No. 10-2020-7009335, Notice of Preliminary Rejection dated Feb. 24, 2021", w English translation, 12 pgs.

"European Application Serial No. 18852509.1, Extended European Search Report dated Apr. 22, 2021", 9 pgs.

* cited by examiner

OPTIMIZED SCAN INTERVAL

PRIORITY APPLICATION

This application is a continuation of U.S. application Ser. No. 16/230,251, filed Dec. 21, 2018, which is a continuation of U.S. application Ser. No. 15/692,407, filed 31 Aug. 2017, now issued as U.S. Pat. No. 10,446,197, all of which are incorporated herein by reference in their entireties.

BACKGROUND

Memory devices are typically provided as internal, semiconductor, integrated circuits in computers or other electronic devices. There are many different types of memory, including volatile and non-volatile memory. Volatile memory requires power to maintain its data, and examples of volatile memory include random-access memory (RAM), dynamic random-access memory (DRAM), and synchronous dynamic random-access memory (SDRAM), among others. Non-volatile memory can retain stored data when not powered, and examples of non-volatile memory include flash memory, read-only memory (ROM), electrically erasable programmable ROM (EEPROM), static RAM (SRAM), erasable programmable ROM (EPROM), resistance variable memory, such as phase-change random-access memory (PCRAM), resistive random-access memory (RRAM), magnetoresistive random-access memory (MRAM), and three-dimensional (3D) XPoint™ memory, among others.

Flash memory is utilized as non-volatile memory for a wide range of electronic applications. Flash memory devices typically include one or more groups of one-transistor, floating gate or charge trap memory cells that allow for high memory densities, high reliability, and low power consumption. Two common types of flash memory array architectures include NAND and NOR architectures, named after the logic form in which the basic memory cell configuration of each is arranged. The memory cells of the memory array are typically arranged in a matrix. In an example, the gates of each floating gate memory cell in a row of the array are coupled to an access line (e.g., a word line). In a NOR architecture, the drains of each memory cell in a column of the array are coupled to a data line (e.g., a bit line). In a NAND architecture, the memory cells in a string of the array are coupled together in series, source to drain, between a source line and a bit line.

Both NOR and NAND architecture semiconductor memory arrays are accessed through decoders that activate specific memory cells by selecting the word line coupled to their gates. In a NOR architecture semiconductor memory array, once activated, the selected memory cells place their data values on bit lines, causing different currents to flow depending on the state at which a particular cell is programmed. In a NAND architecture semiconductor memory array, a high bias voltage is applied to a drain-side select gate (SGD) line. Word lines coupled to the gates of the unselected memory cells of each group are driven at a specified pass voltage (e.g., Vpass) to operate the unselected memory cells of each group as pass transistors (e.g., to pass current in a manner that is unrestricted by their stored data values). Current then flows from the source line to the bit line through each series coupled group, restricted only by the selected memory cells of each group, placing current encoded data values of selected memory cells on the bit lines.

Each flash memory cell in a NOR or NAND architecture semiconductor memory array can be programmed individually or collectively to one or a number of programmed states. For example, a single-level cell (SLC) can represent one of two programmed states (e.g., 1 or 0), representing one bit of data. However, flash memory cells can also represent one of more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC can refer to a memory cell that can store two bits of data per cell (e.g., one of four programmed states), a triple-level cell (TLC) can refer to a memory cell that can store three bits of data per cell (e.g., one of eight programmed states), and a quad-level cell (QLC) can store four bits of data per cell. MLC is used herein in its broader context, to can refer to any memory cell that can store more than one bit of data per cell (i.e., that can represent more than two programmed states).

Traditional memory arrays are two-dimensional (2D) structures arranged on a surface of a semiconductor substrate. To increase memory capacity for a given area, and to decrease cost, the size of the individual memory cells has decreased. However, there is a technological limit to the reduction in size of the individual memory cells, and thus, to the memory density of 2D memory arrays. In response, three-dimensional (3D) memory structures, such as 3D NAND architecture semiconductor memory devices, are being developed to further increase memory density and lower memory cost.

Such 3D NAND devices often include strings of storage cells, coupled in series (e.g., drain to source), between one or more source-side select gates (SGSs) proximate a source, and one or more drain-side select gates (SGDs) proximate a bit line. In an example, the SGSs or the SGDs can include one or more field-effect transistors (FETs) or metal-oxide semiconductor (MOS) structure devices, etc. In some examples, the strings will extend vertically, through multiple vertically spaced tiers containing respective word lines. A semiconductor structure (e.g., a polysilicon structure) may extend adjacent a string of storage cells to form a channel for the storages cells of the string. In the example of a vertical string, the polysilicon structure may be in the form of a vertically extending pillar. In some examples, the string may be "folded," and thus arranged relative to a U-shaped pillar. In other examples, multiple vertical structures may be stacked upon one another to form stacked arrays of storage cell strings.

Memory arrays or devices can be combined together to form a storage volume of a memory system, such as a solid-state drive (SSD), a Universal Flash Storage (UFS™) device, a MultiMediaCard (MMC) solid-state storage device, an embedded MMC device (eMMC™), etc. An SSD can be used as, among other things, the main storage device of a computer, having advantages over traditional hard drives with moving parts with respect to, for example, performance, size, weight, ruggedness, operating temperature range, and power consumption. For example, SSDs can have reduced seek time, latency, or other delay associated with magnetic disk drives (e.g., electromechanical, etc.). SSDs use non-volatile memory cells, such as flash memory cells to obviate internal battery supply requirements, thus allowing the drive to be more versatile and compact.

An SSD can include a number of memory devices, including a number of dies or logical units (e.g., logical unit numbers or LUNs), and can include one or more processors or other controllers performing logic functions required to operate the memory devices or interface with external systems. Such SSDs may include one or more flash memory die, including a number of memory arrays and peripheral circuitry thereon. The flash memory arrays can include a number of blocks of memory cells organized into a number of physical pages. In many examples, the SSDs will also include DRAM or SRAM (or other forms of memory die or other memory structures). The SSD can receive commands from a host in association with memory operations, such as read or write operations to transfer data (e.g., user data and associated integrity data, such as error data and address data, etc.) between the memory devices and the host, or erase operations to erase data from the memory devices.

In NAND flash based storage systems, a memory cell arranged as SLC or MLC typically contains a charge storage transistor in which the charge stored in the charge storage transistor sets a threshold voltage, $V_t$, of the charge storage transistor. Internal logic of the NAND fixes an association of a different threshold voltage with each state. However, NAND $V_t$s are constantly subjected to shifts due to any of a number of factors. Such factors include read disturb, retention, cross-temperature etc. A count of failed bits can include a function of the mismatch between a value of the read voltage and the NAND Vt. As a result, improvements of NAND flash based storage systems can include improvements in recalibration of read voltages.

BRIEF DESCRIPTION OF THE DRAWINGS

The drawings, which are not necessarily drawn to scale, illustrate generally, by way of example, but not by way of limitation, various embodiments discussed in the present document.

DETAILED DESCRIPTION

Figure 1:
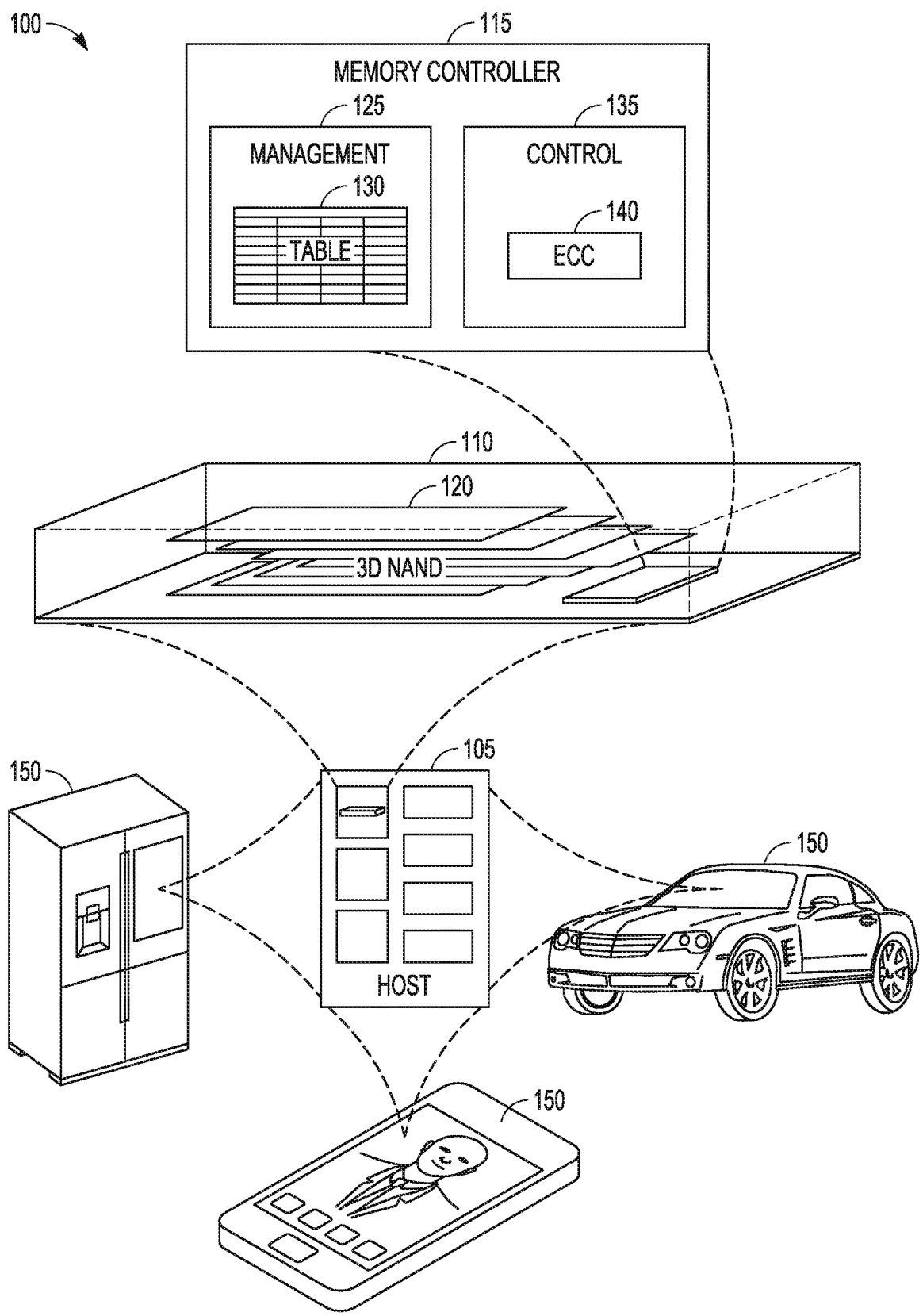
FIG. 1 illustrates an example of an environment including a memory device, according to various embodiments.

In NAND flash based storage systems, fail bit count, from mismatch between the read voltage and a NAND $V_t$, can be minimized by adjusting the read voltage in accordance with the NAND $V_t$. Adjustment of the read voltage can include a read level voltage calibration. Such a read level voltage calibration can involve real time sampling of the NAND raw bit error rate (RBER) at different read voltages. Firmware can be implemented to calibrate the NAND read voltages by issuing scan reads at various read voltages, measuring the RBERs, and determining optimal read voltages for an optimal RBER.

Since sampling the RBER at different read voltages manifests as a host performance impact, the sampling is typically done at time intervals providing a slow enough rate such that sampling activities with respect to the NAND are hardly detected by the host as signal interrupts or delays. In normal operation, reads and writes occur in relatively small numbers such that the intervals for calibrating can be over hours, days, or longer, and can be scheduled according to a usage model such as a day-to-day usage model. In certain cases, such as targeted benchmarks, the NAND $V_t$ shifts happen faster than the time based slower sampling and time based sampling may not be quite effective in these cases. In benchmarking, a large number of read or writes can be sent to the NAND, which number can be orders of magnitude larger than associated with a day-day usage model of the NAND. Benchmarking can provide testing of the capability of the NAND and performance levels of the NAND. However, in cases like benchmarking, read level calibration at intervals associated with typical user usage models may not be appropriate and can be conducted for improved performance of the NAND at shorter intervals.

In various embodiments, read calibration can be triggered using input/output operations per second (IOPS) sampling in addition to time based sampling. IOPS is an input/output performance measurement. In the IOPS based sampling, the firmware for the NAND can track reads and writes separately on the NAND. In response to the tracking, the firmware can trigger the read voltage sampling for each certain numbers of reads or/and writes performed. By using the NAND reads/writes as input parameters, the firmware is better positioned to track the cell $V_t$ movement under targeted benchmark stress conditions on the NAND. The time based sampling can be performed at a slower rate, i.e., at longer intervals, than IOPS sampling of reads/writes. The faster rate of the IOPS based sampling rate can be conducted at a strategically faster rate such that the increased number of samples is buried in the IOPS. Using an approach as taught herein combining time based sampling with IOPS can allow systems to accommodate targeted benchmarks with accelerated sampling without affecting the performance and latency of typical user workloads.

Electronic devices, such as mobile electronic devices (e.g., smart phones, tablets, etc.), electronic devices for use in automotive applications (e.g., automotive sensors, control units, driver-assistance systems, passenger safety or comfort systems, etc.), and internet-connected appliances or devices (e.g., internet-of-things (IoT) devices, etc.), have varying storage needs depending on, among other things, the type of electronic device, use environment, performance expectations, etc.

Electronic devices can be broken down into several main components: a processor (e.g., a central processing unit (CPU) or other main processor); memory (e.g., one or more volatile or non-volatile random-access memory (RAM) memory device, such as dynamic RAM (DRAM), mobile or low-power double-data-rate synchronous DRAM (DDR SDRAM), etc.); and a storage device (e.g., non-volatile memory (NVM) device, such as flash memory, read-only memory (ROM), an SSD, an MMC, or other memory card structure or assembly, etc.). In certain examples, electronic devices can include a user interface (e.g., a display, touchscreen, keyboard, one or more buttons, etc.), a graphics processing unit (GPU), a power management circuit, a baseband processor or one or more transceiver circuits, etc.

FIG. 1 illustrates an example of an environment 100 including a host device 105 and a memory device 110 configured to communicate over a communication interface. The host device 105 or the memory device 110 may be included in a variety of products 150, such as Internet of Things (IoT) devices (e.g., a refrigerator or other appliance, sensor, motor or actuator, mobile communication device, automobile, drone, etc.) to support processing, communications, or control of the product 150.

The memory device 110 includes a memory controller 115 and a memory array 120 including, for example, a number of individual memory die (e.g., a stack of three-dimensional (3D) NAND die). In 3D architecture semiconductor memory technology, vertical structures are stacked, increasing the number of tiers, physical pages, and accordingly, the density of a memory device (e.g., a storage device). In an example, the memory device 110 can be a discrete memory or storage device component of the host device 105. In other examples, the memory device 110 can be a portion of an integrated circuit (e.g., system on a chip (SOC), etc.), stacked or otherwise included with one or more other components of the host device 105.

One or more communication interfaces can be used to transfer data between the memory device 110 and one or more other components of the host device 105, such as a Serial Advanced Technology Attachment (SATA) interface, a Peripheral Component Interconnect Express (PCIe) interface, a Universal Serial Bus (USB) interface, a Universal Flash Storage (UFS) interface, an eMMC™ interface, or one or more other connectors or interfaces. The host device 105 can include a host system, an electronic device, a processor, a memory card reader, or one or more other electronic devices external to the memory device 110. In some examples, the host 105 may be a machine having some portion, or all, of the components discussed in reference to the machine 500 of FIG. 5.

The memory controller 115 can receive instructions from the host 105, and can communicate with the memory array, such as to transfer data to (e.g., write or erase) or from (e.g., read) one or more of the memory cells, planes, sub-blocks, blocks, or pages of the memory array. The memory controller 115 can include, among other things, circuitry or firmware, including one or more components or integrated circuits. For example, the memory controller 115 can include one or more memory control units, circuits, or components configured to control access across the memory array 120 and to provide a translation layer between the host 105 and the memory device 110. The memory controller 115 can include one or more input/output (I/O) circuits, lines, or interfaces to transfer data to or from the memory array 120. The memory controller 115 can include a memory manager 125 and an array controller 135.

The memory manager 125 can include, among other things, circuitry or firmware, such as a number of components or integrated circuits associated with various memory management functions. For purposes of the present description example memory operation and management functions will be described in the context of NAND memory. Persons skilled in the art will recognize that other forms of non-volatile memory may have analogous memory operations or management functions. Such NAND management functions include wear leveling (e.g., garbage collection or reclamation), error detection or correction, block retirement, or one or more other memory management functions. The memory manager 125 can parse or format host commands (e.g., commands received from a host) into device commands (e.g., commands associated with operation of a memory array, etc.), or generate device commands (e.g., to accomplish various memory management functions) for the array controller 135 or one or more other components of the memory device 110.

The memory manager 125 can include a set of management tables 130 configured to maintain various information associated with one or more component of the memory device 110 (e.g., various information associated with a memory array or one or more memory cells coupled to the memory controller 115). For example, the management tables 130 can include information regarding block age, block erase count, error history, or one or more error counts (e.g., a write operation error count, a read bit error count, a read operation error count, an erase error count, etc.) for one or more blocks of memory cells coupled to the memory controller 115. In certain examples, if the number of detected errors for one or more of the error counts is above a threshold, the bit error can be referred to as an uncorrectable bit error. The management tables 130 can maintain a count of correctable or uncorrectable bit errors, among other things.

The array controller 135 can include, among other things, circuitry or components configured to control memory operations associated with writing data to, reading data from, or erasing one or more memory cells of the memory device 110 coupled to the memory controller 115. The memory operations can be based on, for example, host commands received from the host 105, or internally generated by the memory manager 125 (e.g., in association with wear leveling, error detection or correction, etc.).

The array controller 135 can include an error correction code (ECC) component 140, which can include, among other things, an ECC engine or other circuitry configured to detect or correct errors associated with writing data to or reading data from one or more memory cells of the memory device 110 coupled to the memory controller 115. The memory controller 115 can be configured to actively detect and recover from error occurrences (e.g., bit errors, operation errors, etc.) associated with various operations or storage of data, while maintaining integrity of the data transferred between the host 105 and the memory device 110, or maintaining integrity of stored data (e.g., using redundant RAID storage, etc.), and can remove (e.g., retire) failing memory resources (e.g., memory cells, memory arrays, pages, blocks, etc.) to prevent future errors.

The memory array 120 can include several memory cells arranged in, for example, a number of devices, planes, sub-blocks, blocks, or pages. As one example, a 48 GB TLC NAND memory device can include 18,592 bytes (B) of data per page (16,384+2208 bytes), 1536 pages per block, 548 blocks per plane, and 4 or more planes per device. As another example, a 32 GB MLC memory device (storing two bits of data per cell (i.e., 4 programmable states)) can include 18,592 bytes (B) of data per page (16,384+2208 bytes), 1024 pages per block, 548 blocks per plane, and 4 planes per device, but with half the required write time and twice the program/erase (P/E) cycles as a corresponding TLC memory device. Other examples can include other numbers or arrangements. In some examples, a memory device, or a portion thereof, may be selectively operated in SLC mode, or in a desired MLC mode (such as TLC, QLC, etc.).

In operation, data is typically written to or read from the NAND memory device 110 in pages, and erased in blocks. However, one or more memory operations (e.g., read, write, erase, etc.) can be performed on larger or smaller groups of memory cells, as desired. The data transfer size of a NAND memory device 110 is typically referred to as a page; whereas the data transfer size of a host is typically referred to as a sector.

Although a page of data can include a number of bytes of user data (e.g., a data payload including a number of sectors of data) and its corresponding metadata, the size of the page often refers only to the number of bytes used to store the user data. As an example, a page of data having a page size of 4 KB may include 4 KB of user data (e.g., 8 sectors assuming a sector size of 512 B) as well as a number of bytes (e.g., 32 B, 54 B, 224 B, etc.) of metadata corresponding to the user data, such as integrity data (e.g., error detecting or correcting code data), address data (e.g., logical address data, etc.), or other metadata associated with the user data.

Different types of memory cells or memory arrays 120 can provide for different page sizes, or may require different amounts of metadata associated therewith. For example, different memory device types may have different bit error rates, which can lead to different amounts of metadata necessary to ensure integrity of the page of data (e.g., a memory device with a higher bit error rate may require more bytes of error correction code data than a memory device with a lower bit error rate). As an example, a multi-level cell (MLC) NAND flash device may have a higher bit error rate than a corresponding single-level cell (SLC) NAND flash device. As such, the MLC device may require more metadata bytes for error data than the corresponding SLC device.

Figure 2:
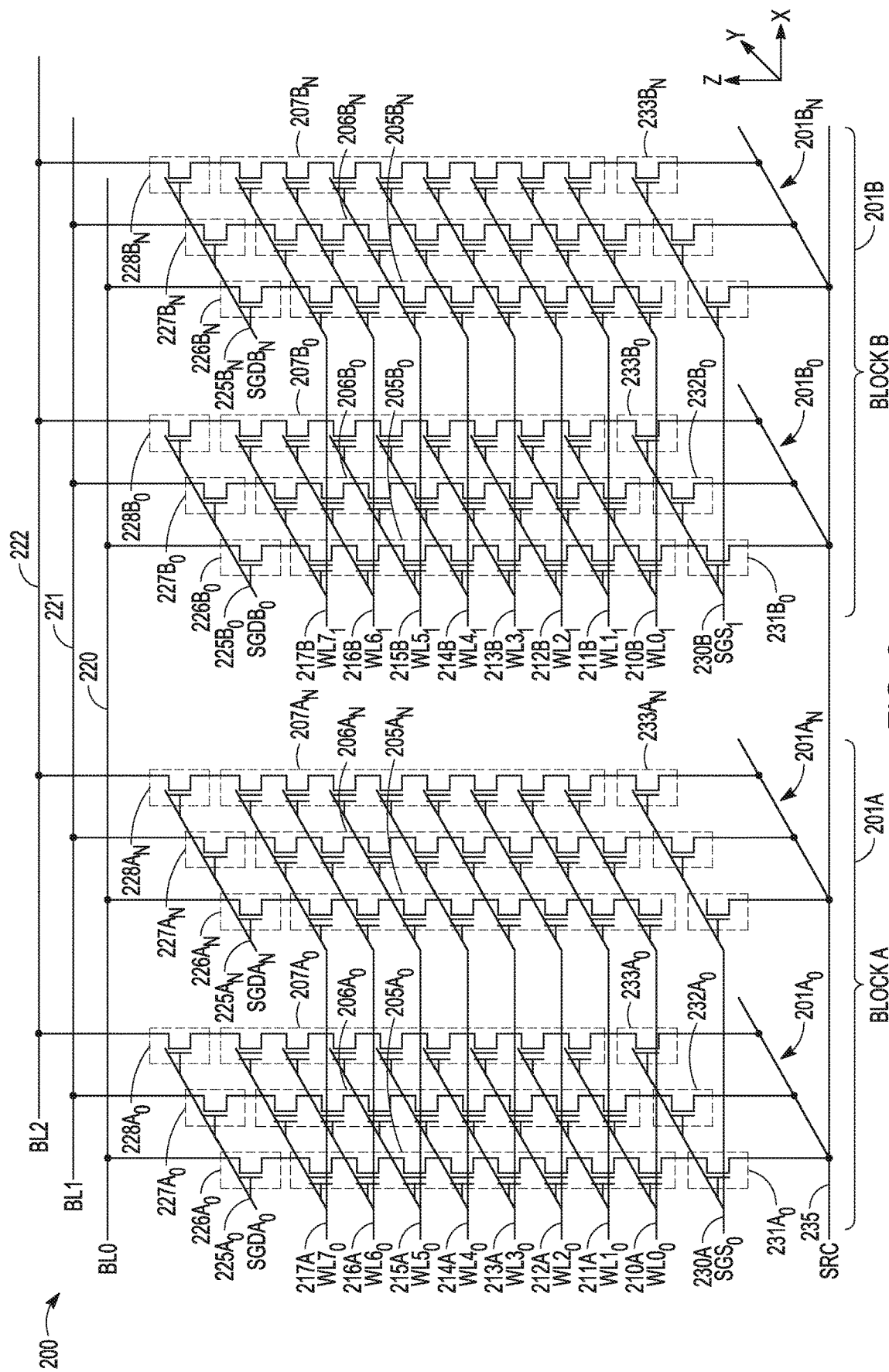
FIGS. 2 and 3 illustrate schematic diagrams of an example of a three-dimensional NAND architecture semiconductor memory array, according to various embodiments.

FIG. 2 illustrates an example schematic diagram of a 3D NAND architecture semiconductor memory array 200 including a number of strings of memory cells (e.g., first-third $A_0$ memory strings $205A_0$-$207A_0$, first-third $A_n$ memory strings $205A_n$-$207A_n$, first-third $B_0$ memory strings $205B_0$-$207B_0$, first-third $B_n$ memory strings $205B_n$-$207B_n$, etc.), organized in blocks (e.g., block A 201A, block B 201B, etc.) and sub-blocks (e.g., sub-block $A_0$ 201$A_0$, sub-block $A_n$ 201$A_n$, sub-block $B_0$ 201$B_0$, sub-block $B_n$ 201$B_n$, etc.). The memory array 200 represents a portion of a greater number of similar structures that would typically be found in a block, device, or other unit of a memory device.

Each string of memory cells includes a number of tiers of charge storage transistors (e.g., floating gate transistors, charge-trapping structures, etc.) stacked in the Z direction, source to drain, between a source line (SRC) 235 or a source-side select gate (SGS) (e.g., first-third $A_0$ SGS $231A_0$-$233A_0$, first-third $A_n$ SGS $231A_n$-$233A_n$, first-third $B_0$ SGS $231B_0$-$233B_0$, first-third $B_n$ SGS $231B_n$-$233B_n$, etc.) and a drain-side select gate (SGD) (e.g., first-third $A_0$ SGD $226A_0$-$228A_0$, first-third $A_n$ SGD $226A_n$-$228A_n$, first-third $B_0$ SGD $226B_0$-$228B_0$, first-third $B_n$ SGD $226B_n$-$228B_n$, etc.). Each string of memory cells in the 3D memory array can be arranged along the X direction as data lines (e.g., bit lines (BL) BL0-BL2 220-222), and along the Y direction as physical pages.

Within a physical page, each tier represents a row of memory cells, and each string of memory cells represents a column. A sub-block can include one or more physical pages. A block can include a number of sub-blocks (or physical pages) (e.g., 128, 256, 384, etc.). Although illustrated herein as having two blocks, each block having two sub-blocks, each sub-block having a single physical page, each physical page having three strings of memory cells, and each string having 8 tiers of memory cells, in other examples, the memory array 200 can include more or fewer blocks, sub-blocks, physical pages, strings of memory cells, memory cells, or tiers. For example, each string of memory cells can include more or fewer tiers (e.g., 16, 32, 64, 128, etc.), as well as one or more additional tiers of semiconductor material above or below the charge storage transistors (e.g., select gates, data lines, etc.), as desired. As an example, a 48 GB TLC NAND memory device can include 18,592 bytes (B) of data per page (16,384+2208 bytes), 1536 pages per block, 548 blocks per plane, and 4 or more planes per device.

Each memory cell in the memory array 200 includes a control gate (CG) coupled to (e.g., electrically or otherwise operatively connected to) an access line (e.g., word lines (WL) $WL0_0$-$WL7_0$ 210A-217A, $WL0_1$-$WL7_1$ 210B-217B, etc.), which collectively couples the control gates (CGs) across a specific tier, or a portion of a tier, as desired. Specific tiers in the 3D memory array, and accordingly, specific memory cells in a string, can be accessed or controlled using respective access lines. Groups of select gates can be accessed using various select lines. For example, first-third $A_0$ SGD $226A_0$-$228A_0$ can be accessed using an $A_0$ SGD line SGDA$_0$ 225$A_0$, first-third $A_n$ SGD $226A_n$-$228A_n$ can be accessed using an $A_n$ SGD line SGDA$_n$ 225$A_n$, first-third $B_0$ SGD $226B_0$-$228B_0$ can be accessed using an $B_0$ SGD line SGDB$_0$ 225$B_0$, and first-third $B_n$ SGD $226B_n$-$228B_n$ can be accessed using an $B_n$ SGD line SGDB$_n$ 225$B_n$. First-third $A_0$ SGS $231A_0$-$233A_0$ and first-third $A_n$ SGS $231A_n$-$233A_n$ can be accessed using a gate select line SGS$_0$ 230A, and first-third $B_0$ SGS $231B_0$-$233B_0$ and first-third $B_n$ SGS $231B_n$-$233B_n$ can be accessed using a gate select line SGS$_1$ 230B.

In an example, the memory array 200 can include a number of levels of semiconductor material (e.g., polysilicon, etc.) configured to couple the control gates (CGs) of each memory cell or select gate (or a portion of the CGs or select gates) of a respective tier of the array. Specific strings of memory cells in the array can be accessed, selected, or controlled using a combination of bit lines (BLs) and select gates, etc., and specific memory cells at one or more tiers in the specific strings can be accessed, selected, or controlled using one or more access lines (e.g., word lines).

Figure 3:
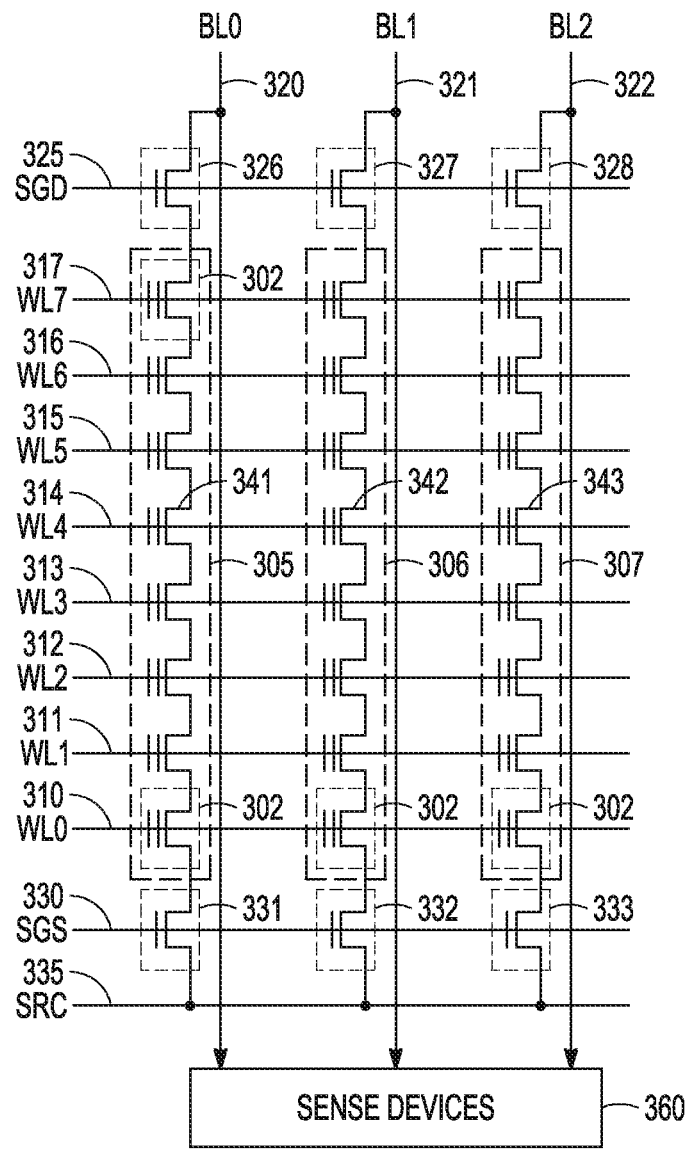

FIG. 3 illustrates an example schematic diagram of a portion of a NAND architecture semiconductor memory array 300 including a plurality of memory cells 302 arranged in a two-dimensional array of strings (e.g., first-third strings 305-307) and tiers (e.g., illustrated as respective word lines (WL) WL0-WL7 310-317, a drain-side select gate (SGD) line 325, a source-side select gate (SGS) line 330, etc.), and sense amplifiers or devices 360. For example, the memory array 300 can illustrate an example schematic diagram of a portion of one physical page of memory cells of a 3D NAND architecture semiconductor memory device, such as illustrated in FIG. 2.

Each string of memory cells is coupled to a source line (SRC) 335 using a respective source-side select gate (SGS) (e.g., first-third SGS 331-333), and to a respective data line (e.g., first-third bit lines (BL) BL0-BL2 320-322) using a respective drain-side select gate (SGD) (e.g., first-third SGD 326-328). Although illustrated with 8 tiers (e.g., using word lines (WL) WL0-WL7 310-317) and three data lines (BL0-BL2 326-328) in the example of FIG. 3, other examples can include strings of memory cells having more or fewer tiers or data lines, as desired.

In a NAND architecture semiconductor memory array, such as the example memory array 300, the state of a selected memory cell 302 can be accessed by sensing a current or voltage variation associated with a particular data line containing the selected memory cell. The memory array 300 can be accessed (e.g., by a control circuit, one or more processors, digital logic, etc.) using one or more drivers. In an example, one or more drivers can activate a specific memory cell, or set of memory cells, by driving a particular potential to one or more data lines (e.g., bit lines BL0-BL2), access lines (e.g., word lines WL0-WL7), or select gates, depending on the type of operation desired to be performed on the specific memory cell or set of memory cells.

To program or write data to a memory cell, a programming voltage (Vpgm) (e.g., one or more programming pulses, etc.) can be applied to selected word lines (e.g., WL4), and thus, to a control gate of each memory cell coupled to the selected word lines (e.g., first-third control gates (CGs) 341-343 of the memory cells coupled to WL4). Programming pulses can begin, for example, at or near 15V, and, in certain examples, can increase in magnitude during each programming pulse application. While the program voltage is applied to the selected word lines, a potential, such as a ground potential (e.g., Vss), can be applied to the data lines (e.g., bit lines) and substrates (and thus the channels, between the sources and drains) of the memory cells targeted for programming, resulting in a charge transfer (e.g., direct injection or Fowler-Nordheim (FN) tunneling, etc.) from the channels to the floating gates of the targeted memory cells.

In contrast, a pass voltage (Vpass) can be applied to one or more word lines having memory cells that are not targeted for programming, or an inhibit voltage (e.g., Vcc) can be applied to data lines (e.g., bit lines) having memory cells that are not targeted for programming, for example, to inhibit charge from being transferred from the channels to the floating gates of such non-targeted memory cells. The pass voltage can be variable, depending, for example, on the proximity of the applied pass voltages to a word line targeted for programming. The inhibit voltage can include a supply voltage (Vcc), such as a voltage from an external source or supply (e.g., a battery, an AC-to-DC converter, etc.), relative to a ground potential (e.g., Vss).

As an example, if a programming voltage (e.g., 15V or more) is applied to a specific word line, such as WL4, a pass voltage of 10V can be applied to one or more other word lines, such as WL3, WL5, etc., to inhibit programming of non-targeted memory cells, or to retain the values stored on such memory cells not targeted for programming. As the distance between an applied program voltage and the non-targeted memory cells increases, the pass voltage required to refrain from programming the non-targeted memory cells can decrease. For example, where a programming voltage of 15V is applied to WL4, a pass voltage of 10V can be applied to WL3 and WL5, a pass voltage of 8V can be applied to WL2 and WL6, a pass voltage of 7V can be applied to WL1 and WL7, etc. In other examples, the pass voltages, or number of word lines, etc., can be higher or lower, or more or less.

The sense amplifiers 360, coupled to one or more of the data lines (e.g., first, second, or third bit lines (BL0-BL2) 320-322), can detect the state of each memory cell in respective data lines by sensing a voltage or current on a particular data line.

Between applications of one or more programming pulses (e.g., Vpgm), a verify operation can be performed to determine if a selected memory cell has reached its intended programmed state. If the selected memory cell has reached its intended programmed state, it can be inhibited from further programming. If the selected memory cell has not reached its intended programmed state, additional programming pulses can be applied. If the selected memory cell has not reached its intended programmed state after a particular number of programming pulses (e.g., a maximum number), the selected memory cell, or a string, block, or page associated with such selected memory cell, can be marked as defective.

To erase a memory cell or a group of memory cells (e.g., erasure is typically performed in blocks or sub-blocks), an erasure voltage (Vers) (e.g., typically Vpgm) can be applied to the substrates (and thus the channels, between the sources and drains) of the memory cells targeted for erasure (e.g., using one or more bit lines, select gates, etc.), while the word lines of the targeted memory cells are kept at a potential, such as a ground potential (e.g., Vss), resulting in a charge transfer (e.g., direct injection or Fowler-Nordheim (FN) tunneling, etc.) from the floating gates of the targeted memory cells to the channels.

Figure 4:
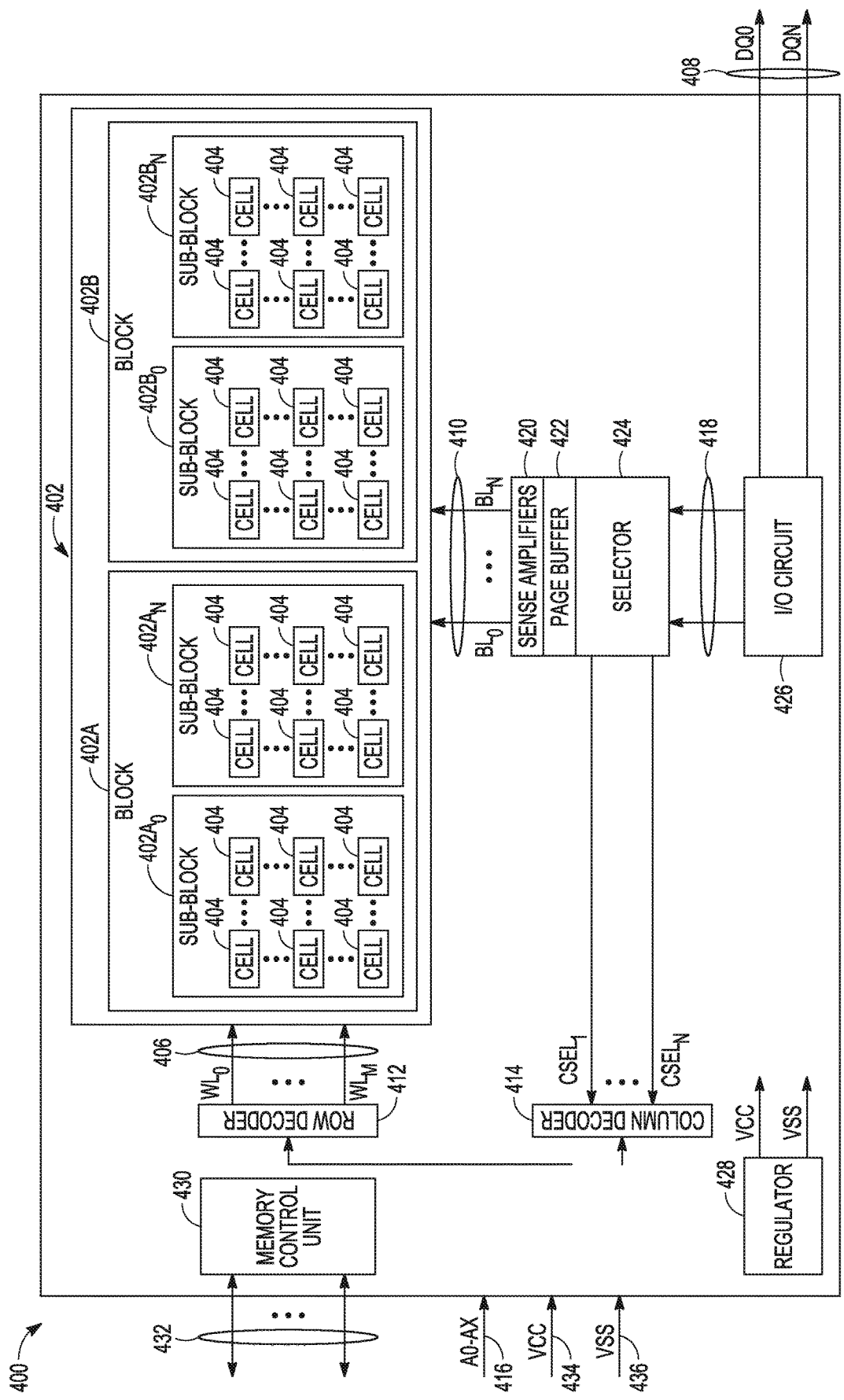
FIG. 4 illustrates an example block diagram of a memory module, according to various embodiments.

FIG. 4 illustrates an example block diagram of a memory device 400 including a memory array 402 having a plurality of memory cells 404, and one or more circuits or components to provide communication with, or perform one or more memory operations on, the memory array 402. The memory device 400 can include a row decoder 412, a column decoder 414, sense amplifiers 420, a page buffer 422, a selector 424, an input/output (I/O) circuit 426, and a memory control unit 430.

The memory cells 404 of the memory array 402 can be arranged in blocks, such as first and second blocks 402A, 402B. Each block can include sub-blocks. For example, the first block 402A can include first and second sub-blocks $402A_0$, $402A_n$, and the second block 402B can include first and second sub-blocks $402B_0$, $402B_n$. Each sub-block can include a number of physical pages, each page including a number of memory cells 404. Although illustrated herein as having two blocks, each block having two sub-blocks, and each sub-block having a number of memory cells 404, in other examples, the memory array 402 can include more or fewer blocks, sub-blocks, memory cells, etc. In other examples, the memory cells 404 can be arranged in a number of rows, columns, pages, sub-blocks, blocks, etc., and accessed using, for example, access lines 406, first data lines 410, or one or more select gates, source lines, etc.

The memory control unit 430 can control memory operations of the memory device 400 according to one or more signals or instructions received on control lines 432, including, for example, one or more clock signals or control signals that indicate a desired operation (e.g., write, read, erase, etc.), or address signals (A0-AX) received on one or more address lines 416. One or more devices external to the memory device 400 can control the values of the control signals on the control lines 432, or the address signals on the address line 416. Examples of devices external to the memory device 400 can include, but are not limited to, a host, a memory controller, a processor, or one or more circuits or components not illustrated in FIG. 4.

The memory device 400 can use access lines 406 and first data lines 410 to transfer data to (e.g., write or erase) or from (e.g., read) one or more of the memory cells 404. The row decoder 412 and the column decoder 414 can receive and decode the address signals (A0-AX) from the address line 416, can determine which of the memory cells 404 are to be accessed, and can provide signals to one or more of the access lines 406 (e.g., one or more of a plurality of word lines (WL0-WLm)) or the first data lines 410 (e.g., one or more of a plurality of bit lines (BL0-BLn)), such as described above.

The memory device 400 can include sense circuitry, such as the sense amplifiers 420, configured to determine the values of data on (e.g., read), or to determine the values of data to be written to, the memory cells 404 using the first data lines 410. For example, in a selected string of memory cells 404, one or more of the sense amplifiers 420 can read a logic level in the selected memory cell 404 in response to a read current flowing in the memory array 402 through the selected string to the data lines 410.

One or more devices external to the memory device 400 can communicate with the memory device 400 using the I/O lines (DQ0-DQN) 408, address lines 416 (A0-AX), or control lines 432. The input/output (I/O) circuit 426 can transfer values of data in or out of the memory device 400, such as in or out of the page buffer 422 or the memory array 402, using the I/O lines 408, according to, for example, the control lines 432 and address lines 416. The page buffer 422 can store data received from the one or more devices external to the memory device 400 before the data is programmed into relevant portions of the memory array 402, or can store data read from the memory array 402 before the data is transmitted to the one or more devices external to the memory device 400.

The column decoder 414 can receive and decode address signals (A0-AX) into one or more column select signals (CSEL1-CSELn). The selector 424 (e.g., a select circuit) can receive the column select signals (CSEL1-CSELn) and select data in the page buffer 422 representing values of data to be read from or to be programmed into memory cells 404. Selected data can be transferred between the page buffer 422 and the I/O circuit 426 using second data lines 418.

The memory control unit 430 can receive positive and negative supply signals, such as a supply voltage (Vcc) 434 and a negative supply (Vss) 436 (e.g., a ground potential), from an external source or supply (e.g., an internal or external battery, an AC-to-DC converter, etc.). In certain examples, the memory control unit 430 can include a regulator 428 to internally provide positive or negative supply signals.

Figure 5:
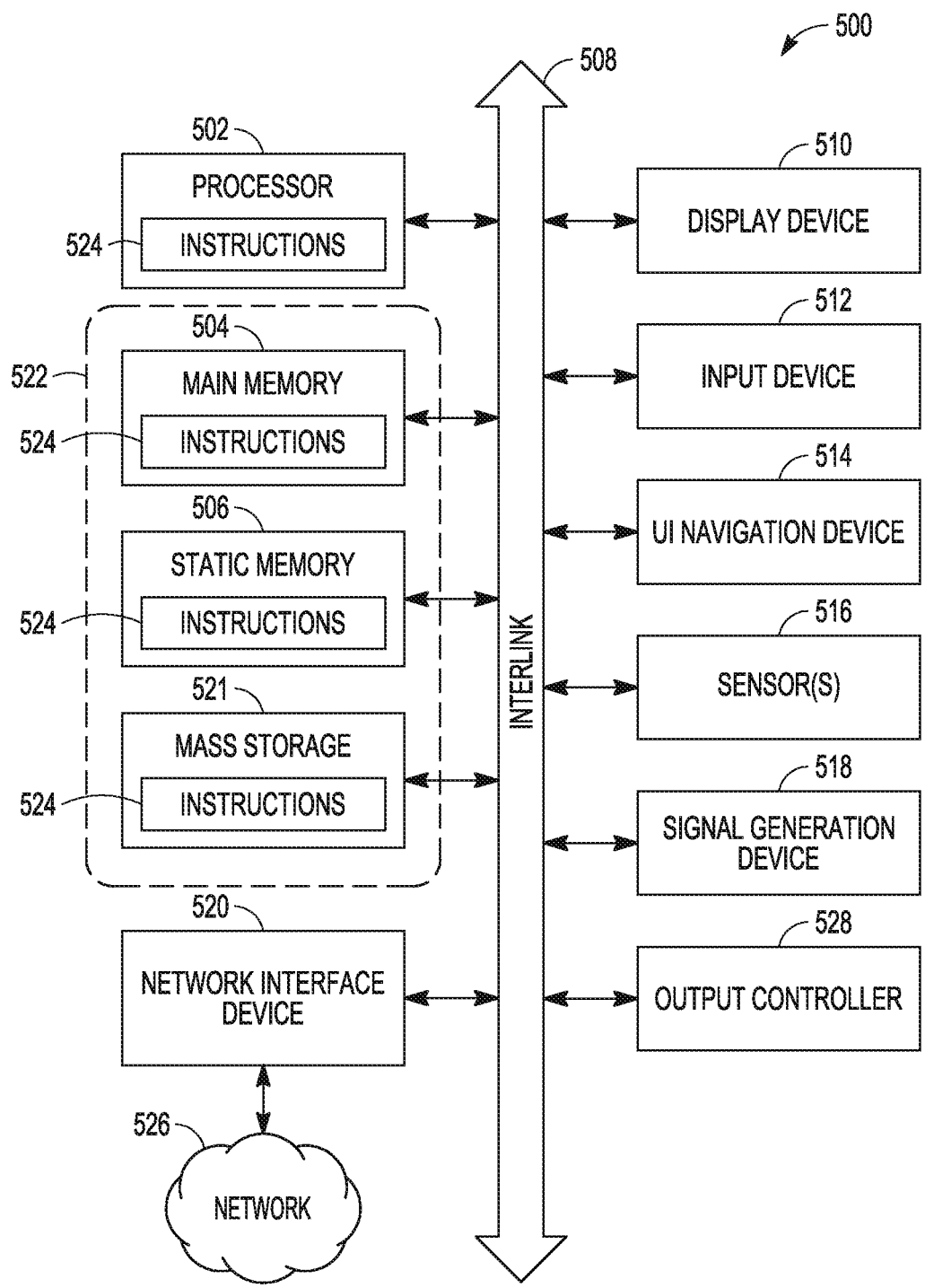
FIG. 5 is a block diagram illustrating an example of a machine upon which one or more embodiments may be implemented, according to various embodiments.

FIG. 5 illustrates a block diagram of an example machine 500 upon which any one or more of the techniques (e.g., methodologies) discussed herein may perform. In alternative embodiments, the machine 500 may operate as a standalone device or may be connected (e.g., networked) to other machines. In a networked deployment, the machine 500 may operate in the capacity of a server machine, a client machine, or both in server-client network environments. In an example, the machine 500 may act as a peer machine in peer-to-peer (P2P) (or other distributed) network environment. The machine 500 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system) 500 (e.g., the host device 105, the memory device 110, etc.) may include a hardware processor 502 (e.g., a central processing unit (CPU), a graphics processing unit (GPU), a hardware processor core, or any combination thereof, such as the memory controller 115, etc.), a main memory 504 and a static memory 56, some or all of which may communicate with each other via an interlink (e.g., bus) 508. The machine 500 may further include a display unit 510, an alphanumeric input device 512 (e.g., a keyboard), and a user interface (UI) navigation device 514 (e.g., a mouse). In an example, the display unit 510, input device 512 and UI navigation device 514 may be a touch screen display. The machine 500 may additionally include a storage device (e.g., drive unit) 521, a signal generation device 518 (e.g., a speaker), a network interface device 520, and one or more sensors 516, such as a global positioning system (GPS) sensor, compass, accelerometer, or other sensor. The machine 500 may include an output controller 528, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 521 may include a machine readable medium 522 on which is stored one or more sets of data structures or instructions 524 (e.g., software) embodying or utilized by any one or more of the techniques or functions described herein. The instructions 524 may also reside, completely or at least partially, within the main memory 504, within static memory 506, or within the hardware processor 502 during execution thereof by the machine 500. In an example, one or any combination of the hardware processor 502, the main memory 504, the static memory 506, or the storage device 521 may constitute the machine readable medium 522.

While the machine readable medium 522 is illustrated as a single medium, the term "machine readable medium" may include a single medium or multiple media (e.g., a centralized or distributed database, or associated caches and servers) configured to store the one or more instructions 524.

The term "machine readable medium" may include any medium that is capable of storing, encoding, or carrying instructions for execution by the machine 500 and that cause the machine 500 to perform any one or more of the techniques of the present disclosure, or that is capable of storing, encoding or carrying data structures used by or associated with such instructions. Non-limiting machine readable medium examples may include solid-state memories, and optical and magnetic media. In an example, a massed machine readable medium comprises a machine-readable medium with a plurality of particles having invariant (e.g., rest) mass. Accordingly, massed machine-readable media are not transitory propagating signals. Specific examples of massed machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 524 (e.g., software, programs, an operating system (OS), etc.) or other data are stored on the storage device 521, can be accessed by the memory 504 for use by the processor 502. The memory 504 (e.g., DRAM) is typically fast, but volatile, and thus a different type of storage than the storage device 521 (e.g., an SSD), which is suitable for long-term storage, including while in an "off" condition. The instructions 524 or data in use by a user or the machine 500 are typically loaded in the memory 504 for use by the processor 502. When the memory 504 is full, virtual space from the storage device 521 can be allocated to supplement the memory 504; however, because the storage device 521 is typically slower than the memory 504, and write speeds are typically at least twice as slow as read speeds, use of virtual memory can greatly reduce user experience due to storage device latency (in contrast to the memory 504, e.g., DRAM). Further, use of the storage device 521 for virtual memory can greatly reduce the usable lifespan of the storage device 521.

In contrast to virtual memory, virtual memory compression (e.g., the Linux® kernel feature "ZRAM") uses part of the memory as compressed block storage to avoid paging to the storage device 521. Paging takes place in the compressed block until it is necessary to write such data to the storage device 521. Virtual memory compression increases the usable size of memory 504, while reducing wear on the storage device 521.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device, and are often removable and separate components from the host device. In contrast, eMMC™ devices are attached to a circuit board and considered a component of the host device, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host device using a low-voltage differential signaling (LVDS) serial interface with dedicated read/write paths, further advancing greater read/write speeds.

The instructions 524 may further be transmitted or received over a communications network 526 using a transmission medium via the network interface device 520 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 520 may include one or more physical jacks (e.g., Ethernet, coaxial, or phone jacks) or one or more antennas to connect to the communications network 526. In an example, the network interface device 520 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 500, and includes digital or analog communications signals or other intangible medium to facilitate communication of such software.

Figure 6:
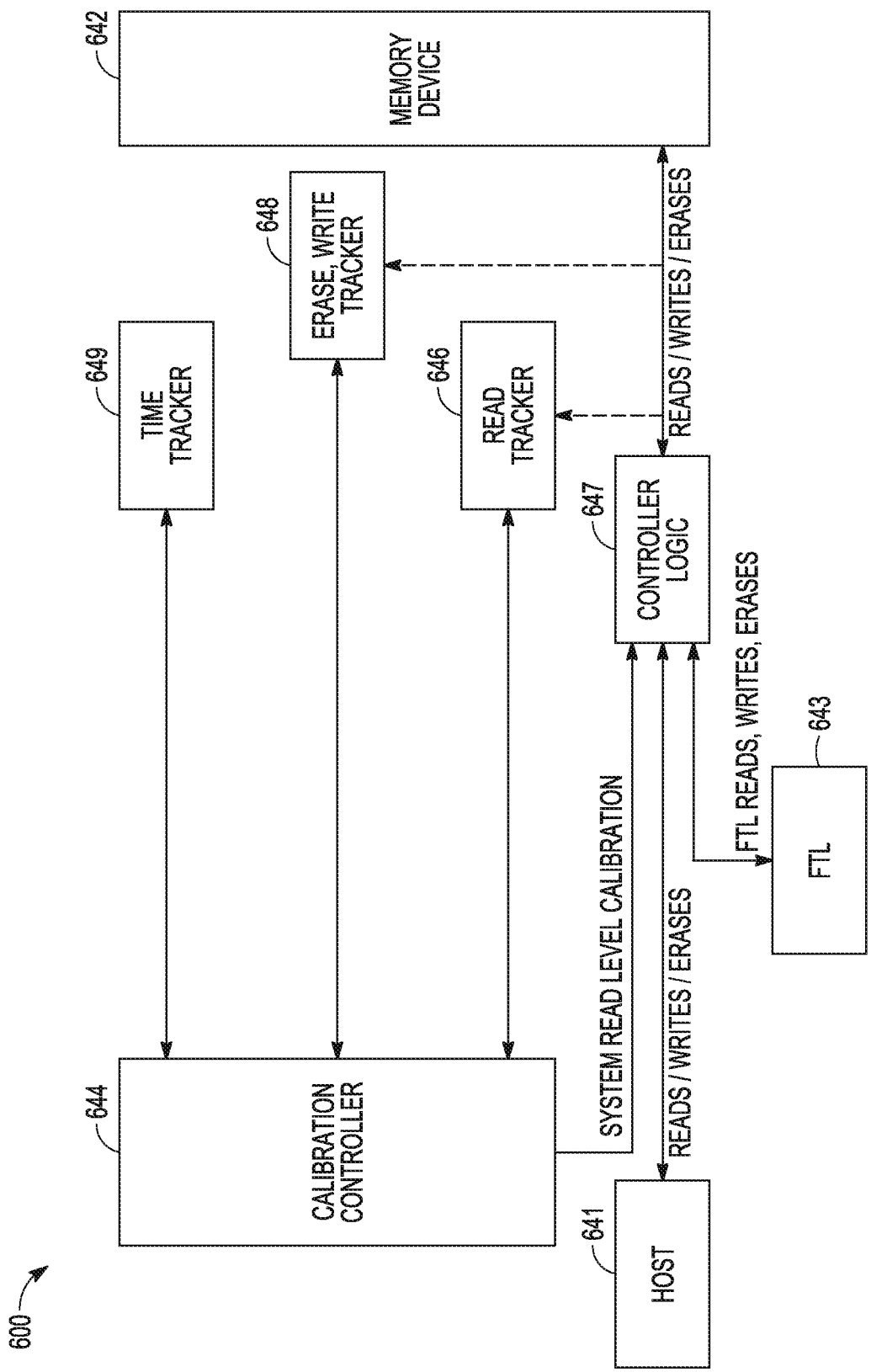
FIG. 6 is a block diagram of features of an example system having a memory device, one or more trackers, and a calibration controller, according to various embodiments.

FIG. 6 is a block diagram of features of a system 600 having a memory device 642, one or more trackers 646, 648, and 649, and a calibration controller 644. Memory device 642 is arranged to receive read and write commands to read from and write to memory cells of an array of memory cells of memory device 642. Memory device 642 can be a NAND memory device. Such a NAND memory device may have an array of memory cells, where the array is structured as a three-dimensional array.

The one or more trackers 646, 648, and 649 can be arranged to monitor parameters including a selected time interval, a number of read operations to read at least a portion of the memory device, and a number of at least one of write operations and erase operations to the at least the portion of the memory device. The one or more trackers can be realized as individual trackers or as trackers structured to monitor more than one tracker. When structured as individual trackers, read tracker 646 can include a counter to count a number of read operations to read at least a portion of the memory device; erase, write tracker 648 can include a counter to count at least one of write operations and erase operations to the at least the portion of the memory device; and time tracker 649 can include a timer to monitor time with respect to an initialization/reset time and a selected time interval. Trackers 646, 648, and 649 can be structured as part of firmware that manages at least some features of memory device 642, or structured as a combination of firmware and counter circuitry.

Calibration controller 644 can be arranged to trigger a read level calibration of memory device 642 based on inputs from the one or more trackers 646, 648, and 649 and a determination of an occurrence of at least one event from a set of events. The set of events can include a monitored time equal to or exceeding the selected time interval, the number of the read operations equal to or exceeding a predetermined threshold for a number of read operations within the selected time interval, and the number of the at least one of write operations and erase operations equal to or exceeding a threshold for a number of at least one of write operations and erase operations within the selected time interval. Calibration controller 644 can include firmware with stored instructions to determine the occurrence based on the inputs from the one or more trackers and stored criteria for a scan of memory device that can provide for a read level calibration. The one or more trackers 646, 648, and 649 and calibration controller 644 may be structured with instructions in a common set of firmware.

Controller logic 647, which communicates with memory device 642 with respect to operating on commands from a host 641, such as memory read and writes of data, can be arranged with calibration controller 644 to receive commands and/or instructions with respect to system read level calibration and generate read commands to memory device 642 for the system read level calibration. In addition, controller logic 647 can provide read and write commands to memory device 642 from flash translation layer (FTL) 643 that includes reads and writes in addition to host defined reads and writes. The term reads can be used to refer to read operations or commands, the term writes can be used to refer to write operations or write commands, and the term erases can be used to refer to erase operations or erase commands. FTL 643 is firmware that can provide some management tasks for memory device 642. FTL 643 can include instructions and routines for firmware generated scans of memory device 642, garbage collection, and other management tasks of memory device 642. Tasks such as garbage collection can be conducted according to a number of conventional techniques. Read tracker 646 can be arranged effectively at the output of controller logic 647 to determine the number of read operations sent to memory device 642. Erase/write tracker 648 can be arranged at the output of controller logic 647 to determine the number of at least one of write operations and erase operations conducted by memory device 642. In various embodiments, erase/write tracker 648 may be realized as two trackers with one for erase operations and one for write operations.

Figure 7:
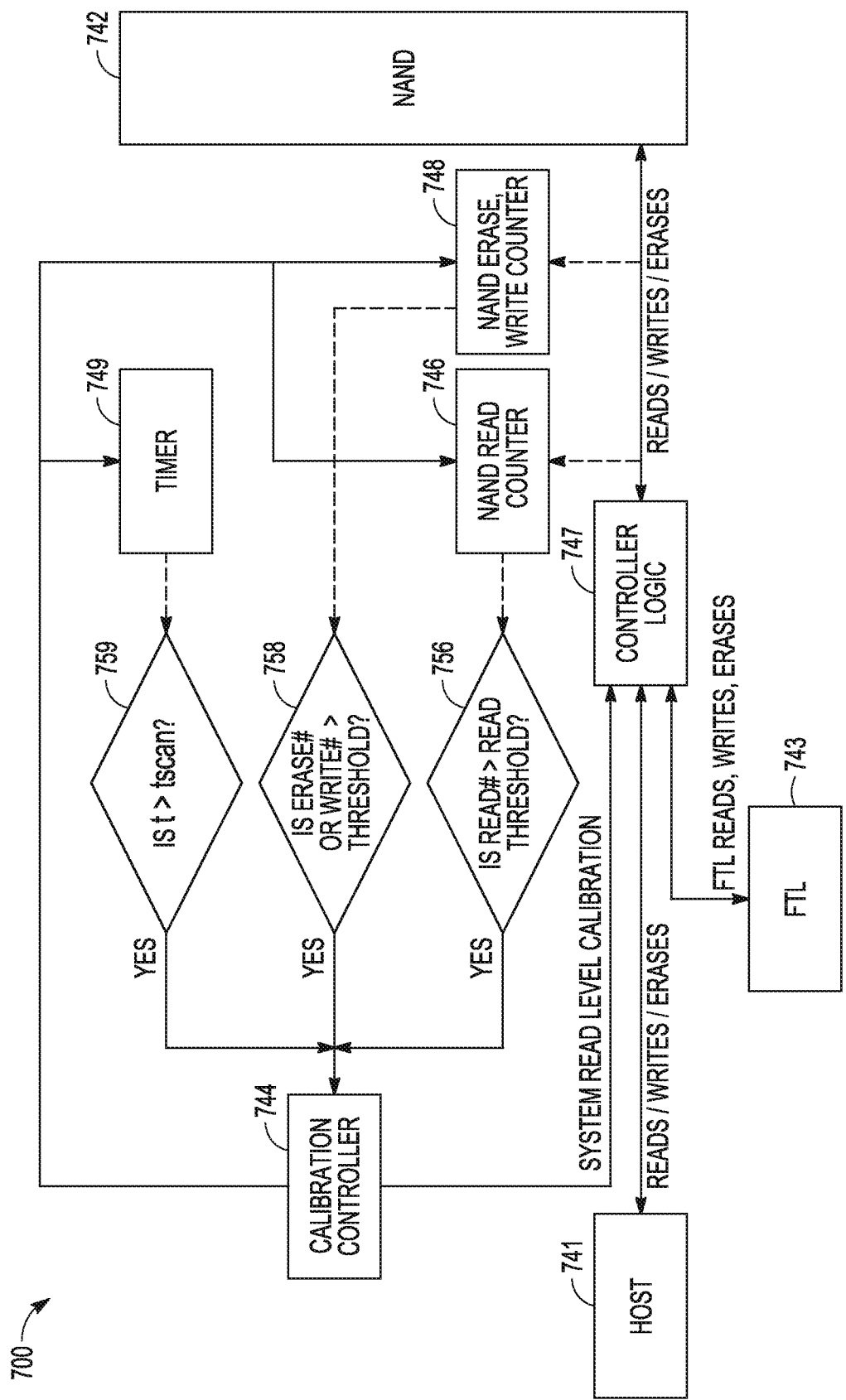
FIG. 7 is a representation of a procedure using combined input/output per second sampling and time based sampling of a NAND memory device, according to various embodiments.

FIG. 7 is a representation of a procedure 700 using combined IOPS sampling and time based sampling of a NAND memory device 742. One or more NAND trackers 746 and 748, time tracker 749, a calibration controller 744, controller logic 747, FTL 743, and a host 741 of FIG. 7 can be arranged similar to the one or more trackers 646, 648, and 649, calibration controller 644, controller logic 647, FTL 643, and host 641, respectively, of FIG. 6. Reads, writes, and erases can be provided to NAND 742 from host 741 via controller logic 747. Read commands for read operations from controller logic 747 can be counted by NAND read tracker, which can be a NAND read counter 746. Signals from NAND 742 regarding write operations and/or erase operations can be counted by NAND erase, write tracker, which can be a NAND erase, write counter 748. In various embodiments, NAND erase, write counter 748 may be realized as two counters with one for erase operations and one for write operations. A time tracker 749 can be structured to provide the time from a reference time. The reference time can be zero correlated to a beginning of the procedure.

The time from the reference time, for instance time zero, can be monitored and compared to a selected time interval. The selected time interval can be the time between scheduled read level calibrations of NAND 742. The time between schedules real level calibrations can be referred to as tscan. Tscan can be set based on a user usage model. Tscan can be set in calibration controller 644 and can be changed with implementation or modification of a user usage model of NAND 742. At 759, a determination can be made as to whether the current monitored time is greater than tscan. If the current monitored time is not greater than tscan, this status need not be provided to calibration controller 744 and time tracker 749 continues to track the time from the reference time. If the current monitored time is greater than tscan, this status can be provided to calibration controller 744, and calibration controller 744 can trigger a read level calibration of NAND 742. Upon triggering the read level calibration or on completion of the read level calibration, calibration controller 744 can reset the time tracker, which can be a timer, to reference zero from which time tracker 749 continues to monitor time. In addition to setting time tracker 749 to reference zero, calibration controller 744 can reset NAND read counter 746 to a reference count, which can be a zero count, and reset NAND erase, write counter 748 to another reference count, which also can be a zero count. In an embodiment, with the monitored time of time tracker 749 equal to tscan, calibration controller 744 can operate in the same manner as for the monitored time being greater than tscan. In an alternative embodiment, with the monitored time of time tracker 749 equal to tscan, calibration controller 744 can operate in the same manner as for the monitored time being less than tscan.

Signals from NAND 742 that indicate completion of write operations and/or erase operations can be monitored to count write operations and/or erase operations by NAND erase, write counter 748. The number of erases counted and the number of writes counted can have different granularity. The number of erases can typically be the average erase count of NAND 742. The number of writes can typically be the number of pages written to NAND 742. At 758, a determination can be made as to whether the number of erases counted and/or the number of writes counted is greater than a predetermined threshold for erases and/or writes. If the current count of erases and/or writes is not greater than the predetermined threshold for erases and/or writes, this status need not be provided to calibration controller 744 and NAND erase, write counter 748 continues to track the number of erases and/or the number of writes. If the current count of erases and/or writes is greater than the predetermined threshold for erases and/or writes, this status can be provided to calibration controller 744, and calibration controller 744 can trigger a read level calibration of NAND 742.

Upon triggering the read level calibration or on completion of the read level calibration, calibration controller 744 can reset NAND erase, write counter 748 to its reference count, which also can be a zero count, from which NAND erase, write counter 748 again starts to count the number of erases and/or the number of writes by NAND 742. In addition to setting NAND erase, write counter 748 to reference count zero, calibration controller 744 can reset time tracker 749 to reference zero and reset NAND read counter to a reference count zero. If the count of NAND erase, write counter 748 does not reach the predetermined threshold for the number of erases and/or the number of writes by NAND 742 by tscan, then the event of the monitored time by time tracker 749 exceeding tscan will result in the NAND erase, write counter 748 being reset to reference zero. With NAND erase, write counter 748 working in conjunction with time tracker 749, the highest count of the NAND erase, write counter 748 occurs within the selected time, tscan. NAND erase, write counter 748 may be arranged as two counters with two predetermined thresholds. In an embodiment, with the monitored count of NAND erase, write counter 748 equal to the predetermined threshold, calibration controller 744 can operate in the same manner as for the count being greater than the threshold. In an alternative embodiment, with the monitored count of NAND erase, write counter 748 equal to its respective predetermined threshold, calibration controller 744 can operate in the manner as for the monitored time being less than the threshold.

Read operations from logic controller 747 to NAND 742 for reading from NAND 742 can be monitored to count read operations by NAND read counter 746. At 756, a determination can be made as to whether the number of read operations counted is greater than a predetermined threshold for read operations for NAND 742. If the current count of reads is not greater than the predetermined threshold for reads from NAND 742, this status need not be provided to calibration controller 744 and NAND read counter 746 continues to track the number of reads. If the current count of reads is greater than the predetermined threshold for reads, this status can be provided to calibration controller 744, and calibration controller 744 can trigger a read level calibration of NAND 742.

Upon triggering the read level calibration or on completion of the read level calibration, calibration controller 744 can reset NAND read counter 746 to its reference count, which also can be a zero count, from which NAND read counter 746 again starts to count the number of reads to NAND 742. In addition to setting NAND read counter 746 to reference count zero, calibration controller 744 can reset time tracker 749 to reference zero and reset NAND erase, write counter 748 to a reference count zero. If the count of NAND read counter 746 does not reach the predetermined threshold for the number of reads by NAND 742 by tscan, then the event of the monitored time by time tracker 749 exceeding tscan will result in the NAND read counter 746 resetting to reference zero. With NAND read counter 746 working in conjunction with time tracker 749, the highest count of the NAND read counter 746 occurs within the selected time, tscan. In an embodiment, with the monitored count of NAND read counter 746 equal to its respective predetermined threshold, calibration controller 744 can operate in the same manner as for the count being greater than the predetermined threshold. In an alternative embodiment, with the monitored count of NAND read counter 746 equal to its respective predetermined threshold, calibration controller 744 can operate in the manner as for the monitored time being less than the threshold.

In the procedure shown in FIG. 7, calibration controller 744 can control read level calibration and management of the reset of the sampling criterion. Once triggered, the read level calibration can be conducted by any of conventional calibrations of read voltages for a NAND. Firmware of calibration controller 744 can include parameters for tscan and thresholds for various count mechanisms. A number of different values for tscans and the threshold values may be stored in calibration controller 744 with selection criteria for selection and implementation of particular values. In addition, the comparison of monitored/measured counts and time to their respective thresholds can be conducted in the firmware of calibration controller 744 resulting in the determination of a number of events occurring. Such a set of events can include a monitored time equal to or exceeding the selected time interval, the number of the read operations equal to or exceeding a predetermined threshold for a number of read operations within the selected time interval, and the number of the at least one of write operations and erase operations equal to or exceeding a threshold for a number of at least one of write operations and erase operations within the selected time interval. Occurrence of one event from a set of events can control the triggering of read level calibration of NAND 742 through the reset procedure by calibration controller 744 to all the trackers 746, 748, and 749.

Figure 8:
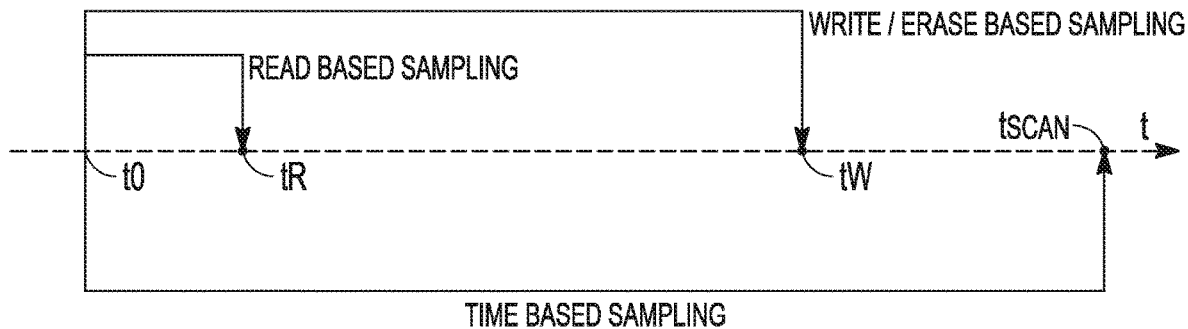
FIG. 8 illustrates timing associated with time based sampling, read based sampling, and write/erase based sampling to trigger read level processing, according to various embodiments.

FIG. 8 illustrates the timing associated with time based sampling, read based sampling, and write/erase based sampling to trigger read level processing. For each of these samplings, the sampling starts at time t0, where time t0 provides a time stamp of previous sample. In read based sampling, the target can be for high quality determination read intensive workloads. If such activities occur, the update frequency of read level calibration, for example, can be every few hours at a time tR, defined by an IOPS attaining a read criterion, from t0. In write/erase based sampling, the target can be for endurance workloads. If such activities occur, the update frequency of read level calibration, for example, can be every day at a time tW, defined by an IOPS attaining an erase/write criterion, from t0. In time based sampling, the target is typical user workloads. If such activities occur, the update frequency of read level calibration, for example, can be every few days at a time tscan, defined by a scheduling that can be based on user usage model, from t0. In operation, read based sampling and write/erase based sampling can be related to targeted benchmarks that are not representative of the typical user workloads. FIG. 8, in some regards, may be viewed as a scheduling for read level calibration every time period tscan with possible interrupts based on IOPS criterion initiating the read level calibration earlier than tscan and restarting the beginning of the tscan period from a new t0.

Read voltage calibration conducted based on a combination of IOPS sampling and time based sampling, as taught herein, can achieve better performance and/or latency for targeted benchmarks with the least or zero impact on the normal user workloads. In addition, such a combined technique, as taught herein, can help the NAND trigger rates for read level calibration to take into consideration targeted benchmarks by triggering calibrations when such targeted benchmarks stress the NAND before the time for scheduled calibration. This procedure can help eliminate NAND overdesign, which otherwise could have resulted in NAND endurance or performance penalty.

Figure 9:
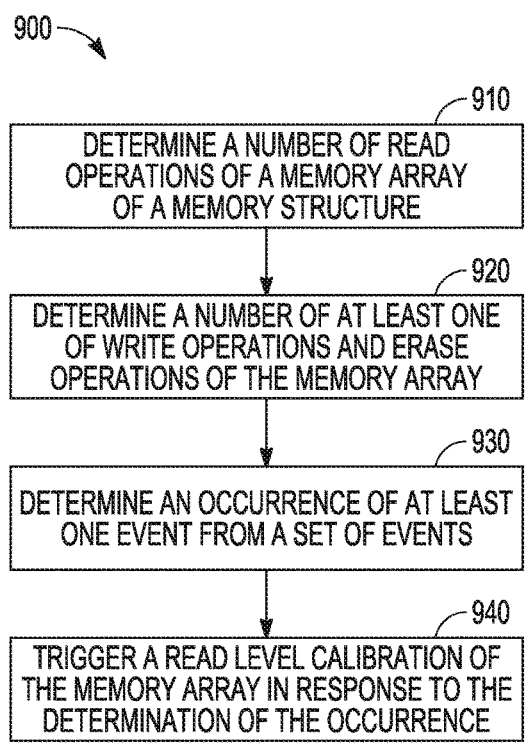
FIG. 9 is a flow diagram of features of an example method of optimizing a scan of a memory device for read level calibration, according to various embodiments.

FIG. 9 is a flow diagram of features of an embodiment of an example method 900 of optimizing a scan of a memory device for read level calibration. At 910, a number of read operations of a memory array of a memory structure is determined. Determining the number of read operations of the memory array can include counting read commands sent to read the memory array. At 920, a number of at least one of write operations and erase operations of the memory array is determined. Determining the number of at least one of write operations and erase operations of the memory array can include counting at least one of write message and erase messages sent in response to conducting at least one of write operations and erase operations in the memory array. At 930, an occurrence of at least one event from a set of events is determined. The set of events can include a monitored time equal to or exceeding a selected time interval, the determined number of read operations of the memory array equal to or exceeding a threshold for a number of read operations of the memory array within the selected time interval, and the determined number of at least one of write operations and erase operations of the memory array equal to or exceeding a threshold for a number of at least one of write operations and erase operations within the selected time interval. At 940, a read level calibration of the memory array is triggered in response to the determination of the occurrence.

Variations of method 900 or methods similar to method 900 can include a number of different embodiments that may be combined depending on the application of such methods and/or the architecture of systems in which such methods are implemented. Such methods can include conducting a read level calibration in response to the triggering, resetting a timer to begin another wait interval for a read level calibration at the selected time interval from the reset value of the timer, and resetting one or more trackers of a number of read operations and a number of at least one of write operations and erase operations of the memory array from the reset value of the timer and within the selected time interval. Resetting the one or more trackers can include resetting a read counter of a number of read operations and a counter of at least one of write operations and erase operations of the memory array.

Method 900 or similar methods can include conducting the triggered read level calibration by sampling memory raw bit error rates at different read voltages to select a set of read voltages with a least raw bit error rate. Method 900 or similar methods can include tracking memory cell threshold voltage movement of the array of memory cells under stress conditions.

Firmware can comprise instructions, such as a microcode, which when executed by a controller, can cause performance of operations comprising: determining a number of read operations of a memory array of a memory structure and a number of at least one of write operations and erase operations of the memory array; determining an occurrence of at least one event from a set of events including a monitored time equal to or exceeding a selected time interval, the determined number of read operations of the memory array equal to or exceeding a threshold for a number of read operations of the memory array within the selected time interval, and the determined number of at least one of write operations and erase operations of the memory array equal to or exceeding a threshold for a number of at least one of write operations and erase operations within the selected time interval; and triggering a read level calibration of the memory array in response to the determination of the occurrence. Determining the number of read operations of the memory array can include counting read commands sent to read the memory array. Determining the number of at least one of write operations and erase operations of the memory array can include counting at least one of write messages and erase messages sent in response to conducting at least one of write operations and erase operations in the memory array.

Instructions of the firmware, which when executed by a controller, can cause performance of operations, which operations can include conducting a read level calibration in response to the triggering, resetting a timer to begin another wait interval for a read level calibration at the selected time interval from the reset value of the timer, and resetting one or more trackers of a number of read operations and a number of at least one of write operations and erase operations of the memory array from the reset value of the timer and within the selected time interval. Resetting the one or more trackers can include resetting a read counter of a number of read operations and a counter of at least one of write operations and erase operations of the memory array.

Instructions of the firmware, which when executed by a controller, can cause performance of operations, where operations can include conducting the triggered read level calibration by sampling memory raw bit error rates at different read voltages to select a set of read voltages with a least raw bit error rate. In addition, instructions, which when executed by a controller, can cause performance of operations, where operations can include tracking memory cell threshold voltage movement of the array of memory cells under stress conditions.

In various embodiment, an apparatus can comprise: a memory device to receive read and write commands to read from and write to memory cells of an array of memory cells of the memory device; one or more trackers to monitor parameters including a selected time interval, a number of read operations to read at least a portion of the memory device, and a number of at least one of write operations and erase operations to the at least the portion of the memory device; and a calibration controller to trigger a read level calibration based on inputs from the one or more trackers and a determination of an occurrence of at least one event from a set of events including a monitored time equal to or exceeding the selected time interval, the number of the read operations equal to or exceeding a predetermined threshold for a number of read operations within the selected time interval, and the number of the at least one of write operations and erase operations equal to or exceeding a threshold for a number of at least one of write operations and erase operations within the selected time interval.

The calibration controller can include firmware with stored instructions to determine the occurrence based on the inputs from the one or more trackers. The calibration controller can be operable to track memory cell threshold voltage movement of the memory cells under stress conditions. In such apparatus, the triggered read level calibration can include a sampling of memory raw bit error rates at different read voltages to select a set of read voltages associated with a least raw bit error rate. In such apparatus, the array of memory cells of the memory device can be structured in a three-dimensional NAND configuration.

In such apparatus, the one or more trackers can include a read counter to count read commands sent to the memory device. The one or more trackers can include at least one of counter to count write and erase messages sent from the memory device in response to conducting at least one of an write and erase operation in the memory array. The one or more trackers can include a timer that is resettable to a reset value by the calibration controller to begin another wait interval for a read level calibration at the selected time interval from the reset value, and the calibration controller can be operable to reset the one or more trackers to track read operations and track at least one of write operations and erase operations from the reset value of the timer.

In various embodiments, a system can comprise: a host processor; a controller coupled to communicate with the host processor; a set of memory devices coupled to the controller, the set of memory devices including a NAND memory device having an array of memory cells to which read and write commands are received from the controller to read from and write to memory cells of the NAND memory device; a set of trackers to monitor time, to track read operations to the memory device, and to track write and/or erase operations communicated from the NAND memory device; and a calibration controller to trigger read level calibration based on inputs from the set of trackers and a determination of an occurrence of at least one event from a set of events including the monitored time exceeding a selected time interval, a number of the read operations equal to or exceeding a predetermined threshold for a number of read operations within the selected time interval, and a number of the write and/or erase operations equal to or exceeding a threshold for a number of write and/or erase operations within the selected time interval. The system can include a flash translation layer that generates read and write operations to the NAND memory device via the controller to manage garbage collection of the array of memory cells of the NAND memory device.

The calibration controller can include firmware with stored instructions to determine the occurrence based on the inputs from the set of trackers. The tracker to track read operations to the NAND memory device can include a read counter to count read commands sent from the controller to the NAND memory device, and the tracker to track write and/or erase operations communicated from the NAND memory device can include a write and/or erase counter to count write and/or erase messages sent by the NAND memory device in response to conducting an write and/or erase operations in the memory array. The tracker to monitor time includes a timer that is resettable to a reset value by the calibration controller to begin another wait interval for a read level calibration at the selected time interval from the reset value, and the calibration controller is operable to reset the tracker to track read operations and the tracker to track write and/or erase operations to track from the reset value of the timer and within the selected time interval.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" may include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

Operating a memory cell, as used herein, includes reading from, writing to, or erasing the memory cell. The operation of placing a memory cell in an intended state is referred to herein as "programming," and can include both writing to or erasing from the memory cell (e.g., the memory cell may be programmed to an erased state).

According to one or more embodiments, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.).

According to one or more embodiments, a memory access device may be configured to provide wear cycle information to the memory device with each memory operation. The memory device control circuitry (e.g., control logic) may be programmed to compensate for memory device performance changes corresponding to the wear cycle information. The memory device may receive the wear cycle information and determine one or more operating parameters (e.g., a value, characteristic) in response to the wear cycle information.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, random access memories (RAMS), read only memories (ROMs), solid state drives (SSDs), Universal Flash Storage (UFS) device, embedded MMC (eMMC) device, and the like.

The above description is intended to be illustrative, and not restrictive. For example, the above-described examples (or one or more aspects thereof) may be used in combination with each other. Other embodiments can be used, such as by one of ordinary skill in the art upon studying the above description. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations.

What is claimed is:

1. A system comprising:
a processing circuit;
a memory device to receive commands to read from and write to memory cells of an array of memory cells of the memory device;
one or more trackers to monitor parameters comprising a selected time interval, a number of read operations to read at least a portion of the memory device, and a number of at least one of write operations and erase operations to the at least the portion of the memory device; and
firmware having stored instructions, executable by the processing circuit, to perform operations comprising an operation to trigger a read calibration of the memory device based on a determination of an occurrence of at least one event, the determination being based on inputs from the one or more trackers.

2. The system of claim 1, wherein the one or more trackers comprises a counter to count the number of read operations to read the at least the portion of the memory device.

3. The system of claim 1, wherein the one or more trackers comprises a counter to count the number of at least one of write operations and erase operations to the at least the portion of the memory device.

4. The system of claim 1, wherein the one or more trackers comprises a timer to monitor time with respect to an initialization time and the selected time interval.

5. The system of claim 1, wherein the at least one event comprises determining that a monitored time equals or exceeds the selected time interval.

6. The system of claim 1, wherein the at least one event comprises determining that the number of read operations is equal to or exceeds a threshold for read operations within the selected time interval.

7. The system of claim 1, wherein the at least one event comprises determining that the number of at least one of write operations and erase operations is equal to or exceeds a threshold for at least one of write operations and erase operations within the selected time interval.

8. The system of claim 1, wherein the triggered read calibration comprises a sampling of memory raw bit error rates at different read voltages to select a set of read voltages associated with a least raw bit error rate.

9. The system of claim 1, wherein the operations further comprise an operation to track memory cell threshold voltage movement of the memory cells under stress conditions.

10. A system comprising:
a processing circuit;
a memory device to receive commands to read from and write to memory cells of an array of memory cells of the memory device;
one or more trackers to monitor parameters comprising a selected time interval, a number of read operations to read at least a portion of the memory device, and a number of at least one of write operations and erase operations to the at least the portion of the memory device;
firmware having stored instructions, executable by the processing circuit, to perform first operations comprising an operation to trigger a read calibration of the memory device based on a determination of an occurrence of at least one event, the determination being based on inputs from the one or more trackers; and
management firmware having stored instructions, executable by the processing circuit, to perform second operations comprising an operation to direct a management task of the memory device.

11. The system of claim 10, wherein the memory device is a three-dimensional NAND memory device and the management task comprises generation of a scan of the three-dimensional NAND memory device and garbage collection in the three-dimensional NAND memory device.

12. The system of claim 10, wherein the one or more trackers comprises a counter to count the number of read operations to read the at least the portion of the memory device.

13. The system of claim 10, wherein the one or more trackers comprises a counter to count the number of at least one of write operations and erase operations to the at least the portion of the memory device.

14. The system of claim 10, wherein the one or more trackers comprises a timer to monitor time with respect to an initialization time and the selected time interval.

15. The system of claim 10, wherein the at least one event comprises determining that a monitored time equals or exceeds the selected time interval.

16. The system of claim 10, wherein the at least one event comprises determining that the number of read operations is equal to or exceeds a threshold for read operations within the selected time interval.

17. The system of claim 10, wherein the at least one event comprises determining that the number of at least one of write operations and erase operations is equal to or exceeds a threshold for at least one of write operations and erase operations within the selected time interval.

18. The system of claim 10, wherein the triggered read calibration comprises a sampling of memory raw bit error rates at different read voltages to select a set of read voltages associated with a least raw bit error rate.

19. A method comprising:
monitoring, using one or more trackers, parameters comprising a selected time interval, a number of read operations to read at least a portion of the memory device, and a number of at least one of write operations and erase operations to the at least the portion of the memory device;
determining an occurrence of at least one event based on inputs from the one or more trackers; and
triggering a read calibration of the memory device based on the determining the occurrence of the at least one event.

20. The method of claim 19, further comprising resetting a time to begin monitor of a sampling for a time interval to trigger another read calibration after a triggered read calibration.

* * * * *